United States Patent

Hirotani et al.

[11] Patent Number: 6,131,276
[45] Date of Patent: Oct. 17, 2000

[54] METHOD AND APPARATUS FOR MOUNTING ELECTRONIC PART

[75] Inventors: Koji Hirotani; Ryoji Inutsuka, both of Osaka; Kunio Ohe, Hirakata, all of Japan

[73] Assignee: Matsushita Electric Industrial Co., Ltd., Osaka, Japan

[21] Appl. No.: 09/029,775

[22] PCT Filed: Sep. 11, 1996

[86] PCT No.: PCT/JP96/02582

§ 371 Date: Mar. 11, 1998

§ 102(e) Date: Mar. 11, 1998

[87] PCT Pub. No.: WO97/10695

PCT Pub. Date: Mar. 20, 1997

[30] Foreign Application Priority Data

Sep. 11, 1995 [JP] Japan .................................. 7-232559

[51] Int. Cl.$^7$ ...................................................... H05K 3/30
[52] U.S. Cl. ................................. 29/832; 29/739; 29/740; 29/743; 29/836; 29/834
[58] Field of Search .............................. 29/832, 836, 739, 29/834, 740, 741, 743

[56] References Cited

U.S. PATENT DOCUMENTS

| | | | |
|---|---|---|---|
| 4,318,465 | 3/1982 | Cavert et al. | 198/341 |
| 4,688,442 | 8/1987 | Seragnoli et al. | 74/426 |
| 4,905,370 | 3/1990 | Hineno et al. | 29/740 |
| 5,060,366 | 10/1991 | Asai et al. | 29/739 |
| 5,265,330 | 11/1993 | Sakaguchi . | |
| 5,579,572 | 12/1996 | Kashiwagi et al. | 29/836 |
| 5,661,239 | 8/1997 | Takeuchi | 73/432.1 |
| 5,784,778 | 7/1998 | Yoshida et al. | 29/834 |
| 5,867,897 | 2/1999 | Mimura et al. | 29/840 |

FOREIGN PATENT DOCUMENTS

| | | |
|---|---|---|
| 4-113698 | 4/1992 | Japan . |
| 7-122891 | 5/1995 | Japan . |

OTHER PUBLICATIONS

Japanese language Search Report for Int'l Application No. PCT/JP96/02582 dated Dec. 3, 1996.
English translation of Japanese language Search Report.
European Search Report dated Oct. 11, 1999, Appn. Number EP 96930352.

Primary Examiner—Jessica J. Harrison
Assistant Examiner—Binh-An Nguyen
Attorney, Agent, or Firm—Ratner & Prestia

[57] ABSTRACT

The invention presents an electronic part mounting method capable of appropriately shortening the mounting cycle depending on the situation of the rotary head.

To achieve the object, the invention relates to electronic part mounting for converting continuous rotation of a rotary head driving motor into intermittent rotation of a rotary head comprising plural suction and mounting nozzles, moving the suction and mounting nozzles up and down in cooperation with the rotation of the rotary head driving motor, and mounting electronic parts by the suction and mounting nozzles while rotating intermittently so as to stop temporarily at plural stations, in which depending on the rotational speed of the rotary head driving motor for sucking and mounting stably when the rotary head is stopped, and the rotational speed of the rotary head driving motor for not changing the suction posture when the rotary head rotates, the rotary head driving motor is rotated at high speed when the rotary head rotates in the case the former is smaller, and the rotary head driving motor is rotated at high speed when sucking and mounting the rotary head in the case the latter is smaller.

3 Claims, 4 Drawing Sheets

METHOD AND APPARATUS FOR MOUNTING ELECTRONIC PART

THIS APPLICATION IS A U.S. NATIONAL PHASE APPLICATION OF PCT INTERNATIONAL APPLICATION PCT/JP96/02582.

TECHNICAL FIELD

The present invention relates to an electronic part mounting method for mounting an electronic part on a substrate, and its apparatus.

BACKGROUND ART

Referring now to the drawings, conventional electronic part mounting is described below.

FIG. 5 is a perspective view of a conventional electronic part mounting apparatus. The electronic part mounting apparatus is basically composed of an XY table 7 for disposing a substrate thereon and moving in two axial directions (X, Y directions), a parts feed table 6 for mounting an electronic part thereon and feeding in a rotary head drive section, and a rotary head drive section 8 for feeding and mounting an electronic part, and by moving the XY table 7, the substrate is moved to a specified mounting position, the part is supplied into a suction nozzle 5 of the rotary head drive section 8 from the parts feed table 6, and the electronic part is supplied and mounted on the substrate by the suction nozzle 5.

FIG. 4 is a perspective view of the rotary drive section 8 in the conventional electronic part mounting apparatus. A rotary head 1 supplies and mounts electronic parts on a plurality of suction nozzles 5 disposed around the rotary head 1, and a rotary head driving motor 2 intermittently rotates the rotary head 1 through a mechanism (not shown) for converting the continuous rotation of the motor 2 into intermittent rotation. Moreover, the rotary head driving motor 2 is to rotate the rotary head 1 and to move up and down the suction nozzles 5, and by rotating a cam 4 through a timing belt 3, the suction nozzle is moved up and down.

FIG. 3 is a diagram to explain the operation of the rotary head, showing the rotary head 1 having sixteen suction and mounting nozzles 5 as an example.

This rotary head 1 rotates intermittently in the arrow direction in the drawing while stopping at each station indicated by ST1 to ST16 in the drawing. At the seventh station (ST7), the electronic parts are sucked by the suction and mounting nozzles 5, and the electronic parts are mounted at the fifteenth station (ST15). Thus, mounting and suction of electronic parts and rotation of the rotary head are executed alternately.

FIG. 2 is a drawing showing rotational speed curve of the rotary head driving motor, and as shown in the drawing the rotational speed $V_L$ (pulses/s) of the rotary head driving motor 2 is constant during the mounting cycle T. Herein, the rotational speed of the rotary head driving motor is defined to be pulses/s, and the acceleration to be pulses/s$^2$. The rotary head driving motor is provided with an encoder as an angle detector in the AC servo motor, and driving of the motor is controlled by using a pulse signal from the encoder. (In this example, 1000 pulses of digital signal are issued per revolution of the motor). Hence, the rotational speed $V_L$ can be defined by the number of encoder pulses for driving the motor per second, so that the quantity of rotation and number of revolutions of the motor can be determined.

The mounting cycle is generally the time required for mounting one part, and as shown in FIG. 2 it is the total time T of rotation of rotary head and suction and mounting of part. More specifically, as shown in FIG. 3, it refers to the time from start of move of the suction nozzle 5 of the rotary head until moving to adjacent suction nozzle and starting to move to next place, and for example, it refers to the time required from star of move of ST7 until suction nozzle 5 starts to move to ST8.

Conventionally, the rotational speed $V_L$ is the lower rotational speed of either the rotational speed for sucking and mounting the electronic part stably when the rotary head 1 is stopped, or the rotational speed not changing in the suction posture when the rotary head 1 rotates.

In the prior art, however, the problem was that the mounting cycle T was dominated only by the lower rotational speed of either the rotational speed of the rotary head driving motor 2 for sucking and mounting stably when the rotary head 1 is stopped, or the rotational speed of the rotary head driving motor 2 not causing change in suction posture when the rotary head 1 rotates. Accordingly, the electronic parts could not be mounted efficiently hitherto.

DISCLOSURE OF THE INVENTION

In the light of the above problems, it is an object of the invention to present an electronic part mounting method and an electronic part mounting apparatus capable of appropriately shortening the mounting cycle depending on the situation of the rotary head.

BEST MODE FOR CARRYING OUT THE INVENTION

To achieve the object, the electronic part mounting method and electronic part mounting apparatus of the invention relate to electronic part mounting for converting continuous rotation of a rotary head driving motor into intermittent rotation of a rotary head comprising plural suction and mounting nozzles, moving the suction and mounting nozzles up and down in cooperation with the rotation of the rotary head driving motor, and mounting electronic parts by the suction and mounting nozzles while rotating intermittently so as to stop temporarily at plural stations, in which depending on the rotational speed of the rotary head driving motor for sucking and mounting stably when the rotary head is stopped, and the rotational speed of the rotary head driving motor for not changing the suction posture when the rotary head rotates, the rotary head driving motor is rotated at high speed when the rotary head rotates in the case the former is smaller, and the rotary head driving motor is rotated at high speed when sucking and mounting the rotary head in the case the latter is smaller.

According to the method and apparatus of the invention, of the rotational speed of the rotary head driving motor for sucking and mounting stably when the rotary head is stopped, and the rotational speed of the rotary head driving motor for not changing the suction posture when the rotary head rotates, if the former is smaller, the rotary head driving motor is rotated at high speed when the rotary head rotates, thereby shortening the mounting cycle, and if the latter is smaller, the rotary head driving motor is rotated at high speed when the rotary head is stopped, that is, when sucking and mounting, thereby shortening the mounting cycle.

First Embodiment

Figure 3:
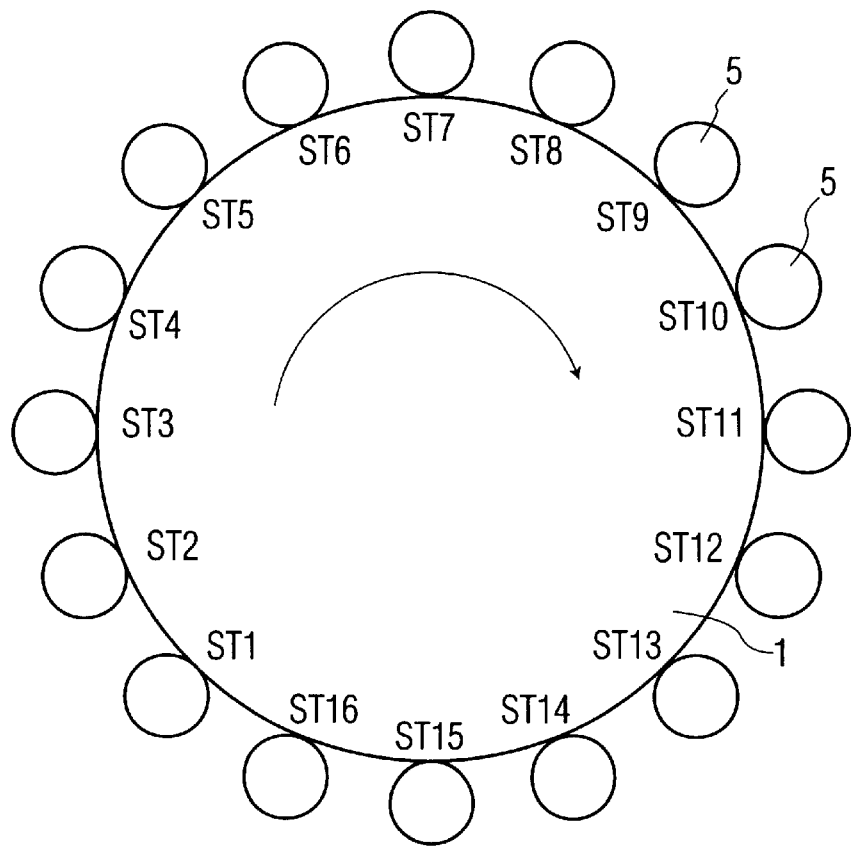
FIG. 3 is a drawing for explaining the operation of rotary head.
Figure 4:
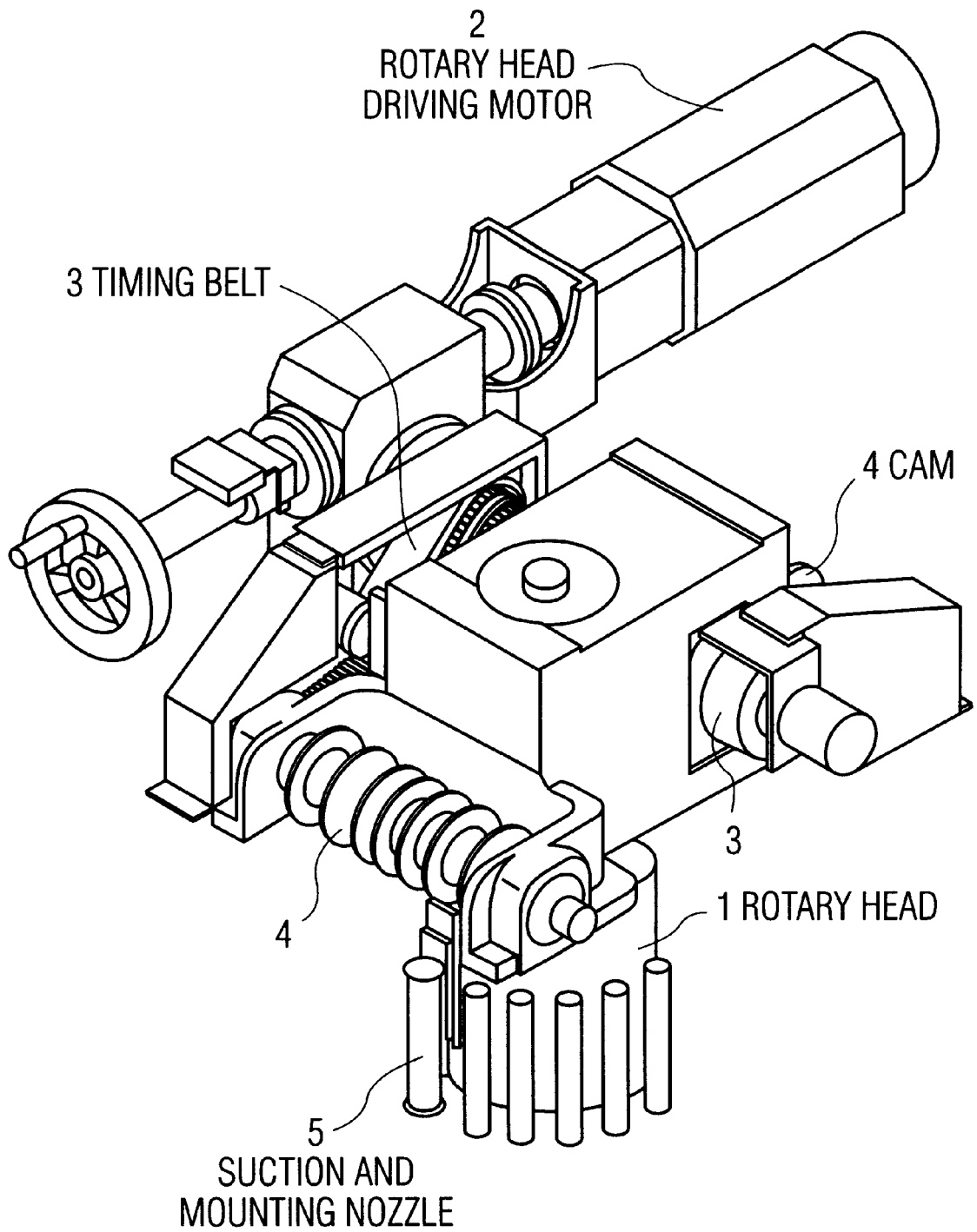
FIG. 4 is a drawing showing a rotary drive section of en electronic part mounting apparatus.
Figure 5:
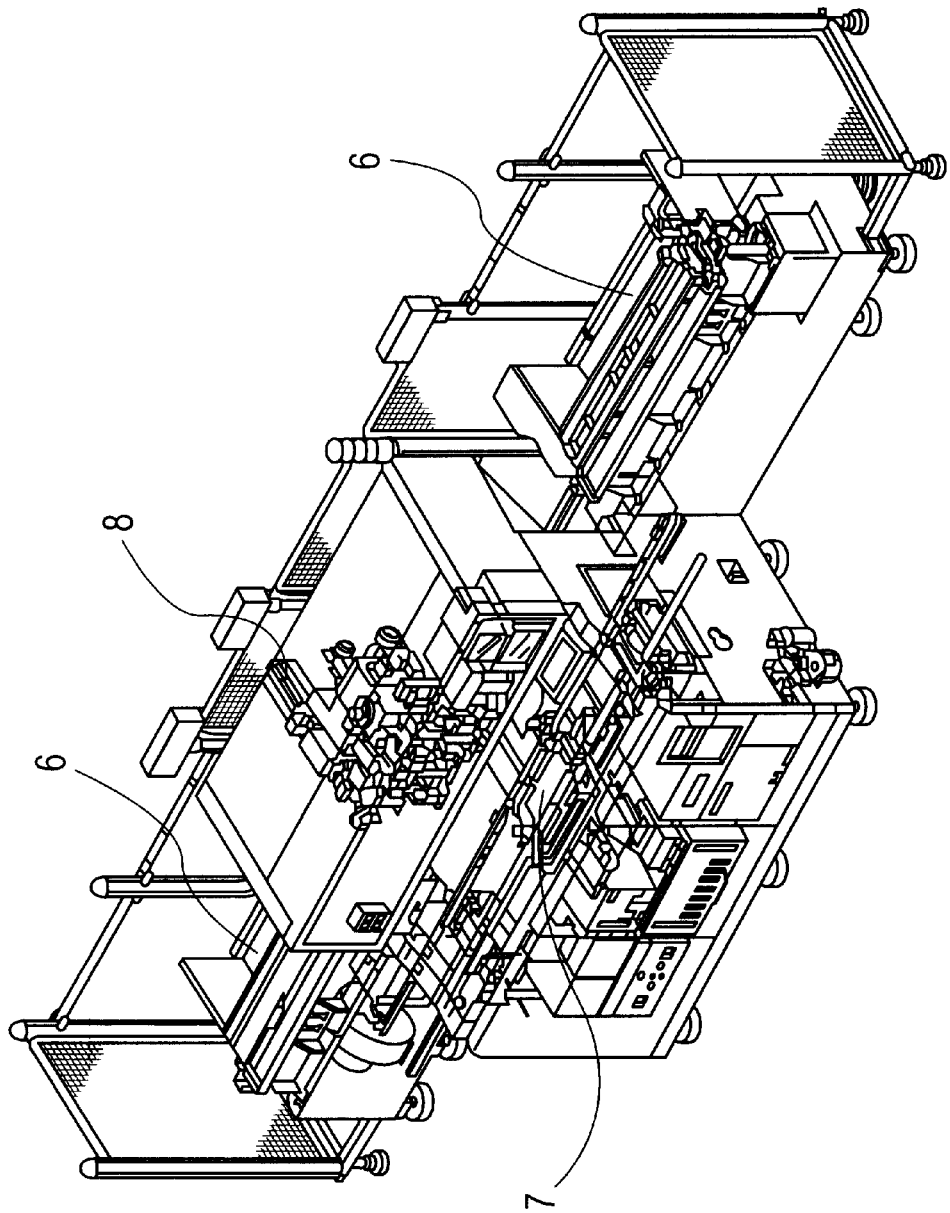
FIG. 5 is a drawing showing an electronic part mounting apparatus.

Referring now to the drawings, an embodiment of the invention is described below. Members corresponding to the members explained in FIG. 1 and FIG. 3 are identified with same reference numerals and detailed description is omitted.

A basic constitution of the rotary head 1 in the embodiment is same as the constitution of the conventional rotary head explained above, and as shown in FIG. 3, the rotary head 1 having sixteen suction and mounting nozzles 5 rotates intermittently in the arrow direction in the drawing while stopping at each station. Suction of electronic part is executed at the seventh station (ST7), and mounting of electronic part, at the fifteenth station (ST15).

Figure 1A:
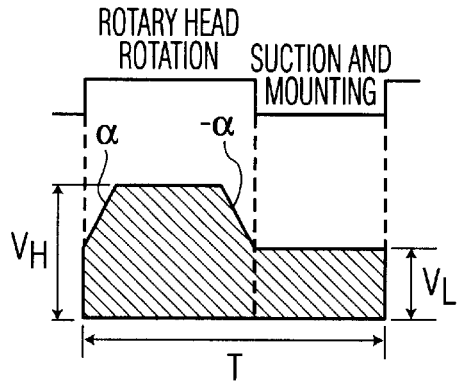
FIG. 1 is a drawing showing a driving speed of a rotary head of an electronic part mounting apparatus in an embodiment of the invention.
Figure 1B:
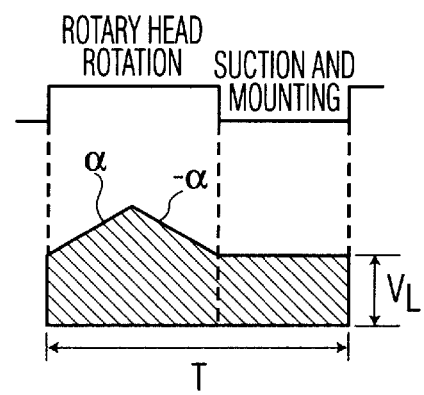
Figure 1C:
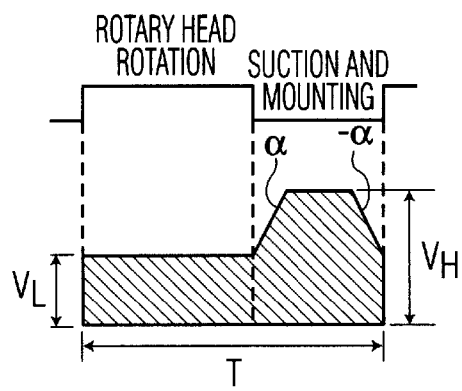

FIG. 1(a) to (d) are diagrams showing the driving speed of the rotary head driving motor 2 in this embodiment, and more specifically FIG. 1(a) and (b) show that the rotational speed of the rotary head driving motor 2 for stably sucking and mounting stably when the rotary head 1 is stopped is smaller than the rotational speed of the rotary head driving motor 2 for not changing the suction posture when the rotary head 1 rotates, and FIG. 1(c) and (d) show that the rotational speed of the rotary head driving motor 2 for stably sucking and mounting stably when the rotary head 1 is stopped is greater than the rotational speed of the rotary head driving motor 2 for not changing the suction posture when the rotary head 1 rotates.

In FIG. 1(a), when the rotary head 1 rotates, the rotary head driving motor 2 is accelerated up to a rotational speed $V_H$ (pulses/s) at an acceleration of (pulses/s$^2$), and after lapse of a specified time, at the same acceleration, it is decelerated to a rotational speed $V_L$ (pulses/s) (at acceleration -). The values of the acceleration and rotational speed $V_H$ are set at values so as not to change suction posture when the rotary head 1 rotates.

Or, as shown in FIG. 1(b), if the maximum speed does not reach $V_H$, after accelerating (acceleration ), it is immediately decelerated (acceleration -). In both FIG. 1(a) and (b), when the rotary head 1 is stopped, that is, when sucking and mounting, the rotational speed of the rotary head driving motor 2 is constant at $V_L$.

Figure 1D:
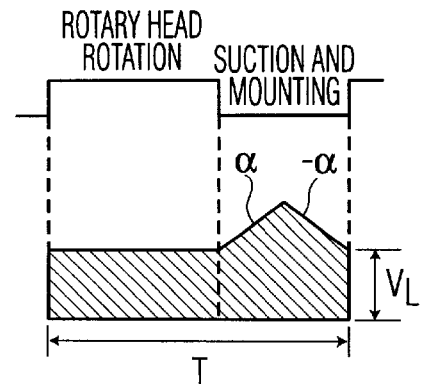

In FIG. 1(c), when the rotary head 1 is stopped, that is, when sucking and mounting, the rotary head driving motor 2 is accelerated up to a rotational speed $V_H$ (pulses/s) at an acceleration of, and after lapse of a specified time, at the same acceleration, it is decelerated to a rotational speed $V_L$. The values of the acceleration and rotational speed $V_H$ are set at values so as to suck and mount stably when the rotary head 1 rotates. Or, as shown in FIG. 1(d), if the maximum speed does not reach $V_H$, after accelerating (acceleration ), it is immediately decelerated (acceleration -). When the rotary head 1 rotates, the rotational speed of the rotary head driving motor 2 is constant at $V_L$.

In this way, of the rotational speed of the rotary head driving motor for sucking and mounting stably when the rotary head is stopped, and the rotational speed of the rotary head driving motor for not changing the suction posture when the rotary head rotates, if the former is smaller, by rotating the rotary head driving motor at high speed when the rotary head rotates, the mounting cycle is shortened, and if the latter is smaller, by rotating the rotary head driving motor at high speed when the rotary head is stopped, that is, when sucking and mounting, the mounting cycle is shortened. As a result, the mounting cycle is shortened while sucking and mounting stably.

The calculation formula of the mounting cycle T in each one of FIG. 1(a) to (d) is shown below. Herein, the number of pulses of the encoder required when the rotary head 1 is stopped, that is, when sucking and mounting is expressed as $I_1$, and the number of pulses of the encoder required when the rotary head 1 rotates is expressed as $I_2$.

In FIG. 1(a), the mounting cycle T is expressed as in formula (1).

$$T=(V_{H-L})^2/(V_H)+I_1/V_H+I_2/V_L \tag{1}$$

In FIG. 1(b), the mounting cycle T is expressed as in formula (2).

$$T=t+I_2/V_L \tag{2}$$

where t is the solution of $$(\tfrac{1}{2})t^2+V_L t-I_1/2=0$$

In FIG. 1(c), the mounting cycle T is expressed as in formula (3).

$$T=(V_H-V_L)^2/(V_H)+I_2/V_H+I_1/V_L \tag{3}$$

In FIG. 1(d), the mounting cycle T is expressed as in formula (4).

$$T=t+I_1/V_L \tag{4}$$

where t is the solution of $$(\tfrac{1}{2})t^2+V_L t-I_2/2=0$$

Figure 2:
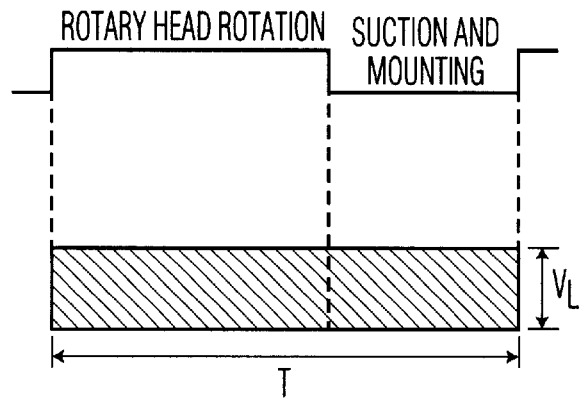
FIG. 2 is a drawing showing the driving speed of a conventional rotary head.

Thus, in FIG. 1 and FIG. 2, the area of the shaded section denotes the number of pulses of the encoder for detecting the rotation, and this area is not changed. Therefore, by referring to the diagrams, it is evident that the mounting cycle T is shortened by using the speed curve of the above rotary head driving motor 2 in the embodiment.

Industrial Applicability

Thus, according to the electronic part mounting method and electronic part mounting apparatus of the invention, of the rotational speed of the rotary head driving motor for sucking and mounting stably when the rotary head is stopped, and the rotational speed of the rotary head driving motor for not changing the suction posture when the rotary head rotates, if the former is smaller, by rotating the rotary head driving motor at high speed when the rotary head rotates, the mounting cycle is shortened, and if the latter is smaller, by rotating the rotary head driving motor at high speed when the rotary head is stopped, that is, when sucking and mounting, the mounting cycle is shortened, so that the mounting cycle can be shortened in stable sucking and mounting operation.

Reference Numerals

1 Rotary head
2 Rotary head driving motor
3 Timing belt
4 Cam
5 Suction and mounting nozzle
6 Parts feed table 7 XY table
8 Rotary head drive section

What is claimed is:

1. An electronic part mounting method for converting continuous rotation of a rotary head driving motor into intermittent rotation of a rotary head, said rotary head having plural suction and mounting nozzles, and said rotary head driving motor having variable rotational speeds including at least a first rotational speed for stable suction and mounting of said electronic part when the rotary head is stopped, and a second rotational speed for not changing the suction posture when the rotary head is rotating, the method comprising the steps of:

moving said plural suction and mounting nozzles up and down in cooperation with the rotation of said rotary head driving motor; and mounting the electronic parts by said plural suction and mounting nozzles;

wherein said rotary head driving motor is accelerated to a higher rotational speed when the rotary head is rotating and the first rotational speed is less than the second rotational speed, thereby reducing the mounting cycle time, and further wherein said rotary head driving motor is accelerated to a higher rotational speed when the rotary head is stopped and the first rotational speed is greater than the second rotational speed, thereby reducing the mounting cycle time.

2. An electronic part mounting apparatus having a rotary head driving motor with variable rotational speeds, and a rotary head, said rotary head having plural suction and mounting nozzles, the mounting apparatus comprising:

means for converting continuous rotation of said rotary head driving motor into intermittent rotation of a rotary head;

and means for moving said plural suction and mounting nozzles up and down in cooperation with the rotation of said rotary head driving motor, for mounting the electronic parts while rotating intermittently;

further comprising means for rotating said rotary head driving motor at different speeds when said rotary head is rotating and when said rotary head is stopped for mounting the electronic parts.

3. An electronic part mounting apparatus of claim 2, wherein said means for rotating said rotary head driving motor at different speeds when said rotary head is rotating and when said rotary head is stopped for mounting the electronic parts, accelerates said rotary head driving motor to a higher rotational speed, (a) when the rotary head is rotating and the rotary head drive motor rotational speed for stable suction and mounting is less than the rotational speed for not changing the suction posture, thereby reducing the mounting cycle time, and (b) when the rotary head is stopped and the rotary head drive motor rotational speed for stable suction and mounting is greater than the rotational speed for not changing the suction posture, thereby reducing the mounting cycle time.

* * * * *

UNITED STATES PATENT AND TRADE MARK OFFICE
CERTIFICATE OF CORRECTION

PATENT NO.   : 6,131,276
DATED        : October 17, 2000
INVENTOR(S)  : Hirotani et al.

It is certified that error appears in the above-identified patent and that said Letters Patent is hereby corrected as shown below:

Cover page, item [57] Abstract, delete in its entirety and insert therefor

--An electronic part mounting method is capable of appropriately shortening the mounting cycle depending on the situation of the rotary head. Continuous rotation of a rotary head driving motor during electronic part mounting is converted into intermittent rotation of a rotary head comprising plural suction and mounting nozzles. The suction and mounting nozzles are moved up and down in cooperation with the rotation of the rotary head driving motor, and electronic parts are mounted by the suction and mounting nozzles while rotating intermittently so as to stop temporarily at plural stations. Depending on the rotational speed of the rotary head driving motor for sucking and mounting stably when the rotary head is stopped, and the rotational speed of the rotary head driving motor for not changing the suction posture when the rotary head rotates, the rotary head driving motor is rotated at high speed when the rotary head rotates in the case the former is smaller, and the rotary head driving motor is rotated at high speed when sucking and mounting the rotary head in the case the latter is smaller.--

Signed and Sealed this

Twenty-ninth Day of May, 2001

Attest:

NICHOLAS P. GODICI

*Attesting Officer*         *Acting Director of the United States Patent and Trademark Office*